United States Patent
de Langen et al.

(10) Patent No.: US 11,456,745 B2
(45) Date of Patent: Sep. 27, 2022

(54) APPARATUS INCLUDING A LEVEL SHIFTER

(71) Applicant: NXP B.V., San Jose, CA (US)

(72) Inventors: Klaas-Jan de Langen, Bergschenhoek (NL); Antonius Martinus Jacobus Daanen, Beuningen (NL); Frederik van den Ende, Apeldoorn (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/028,150

(22) Filed: Sep. 22, 2020

(65) Prior Publication Data
US 2021/0126638 A1 Apr. 29, 2021

(30) Foreign Application Priority Data
Oct. 25, 2019 (EP) .................................. 19205442

(51) Int. Cl.
*H03K 19/0185* (2006.01)
*H03K 3/356* (2006.01)
*H03K 19/003* (2006.01)

(52) U.S. Cl.
CPC ............ *H03K 19/018528* (2013.01); *H03K 3/356113* (2013.01); *H03K 19/00384* (2013.01); *H03K 19/018507* (2013.01); *H03K 19/018521* (2013.01)

(58) Field of Classification Search
CPC ..... H03K 19/018528; H03K 3/356113; H03K 19/00384; H03K 19/00315; H03K 19/01806; H03K 19/017509; H03K 19/017545; H03K 19/018521; H03K 19/018571; H03K 19/018507; H03K 19/0185
See application file for complete search history.

(56) References Cited

U.S. PATENT DOCUMENTS

| | | | |
|---|---|---|---|
| 8,063,662 B2 | 11/2011 | Foley et al. | |
| 9,407,266 B2 | 8/2016 | Ho et al. | |
| 10,014,861 B2 | 7/2018 | Luthra | |
| 10,270,448 B1 | 4/2019 | Blutmna et al. | |
| 2009/0261865 A1* | 10/2009 | Pasqualini | H03K 19/018521 327/108 |
| 2016/0118979 A1 | 4/2016 | Yi et al. | |
| 2018/0294812 A1 | 10/2018 | Tan et al. | |

FOREIGN PATENT DOCUMENTS

WO 2008121977 A2 10/2008

* cited by examiner

*Primary Examiner* — Jung Kim

(57) ABSTRACT

An apparatus comprising a first voltage domain circuit including a first circuit component configured to provide a first digital output signal; a second voltage domain circuit comprising a second circuit component; a level shifter arrangement configured to receive the first digital output signal and generate a second digital output signal based thereon with an increased voltage level of the high state, and provide said second digital output signal to the second circuit component; wherein the level shifter arrangement comprises at least one stage, the at least one stage comprising an arrangement of one or more diode-connected PMOS transistors, coupled to a CMOS inverter arrangement; the CMOS inverter arrangement of a first of the at least one stages configured to receive the first digital output signal and the CMOS inverter arrangement of a final stage of the at least one stages configured to output said second digital output signal.

14 Claims, 4 Drawing Sheets

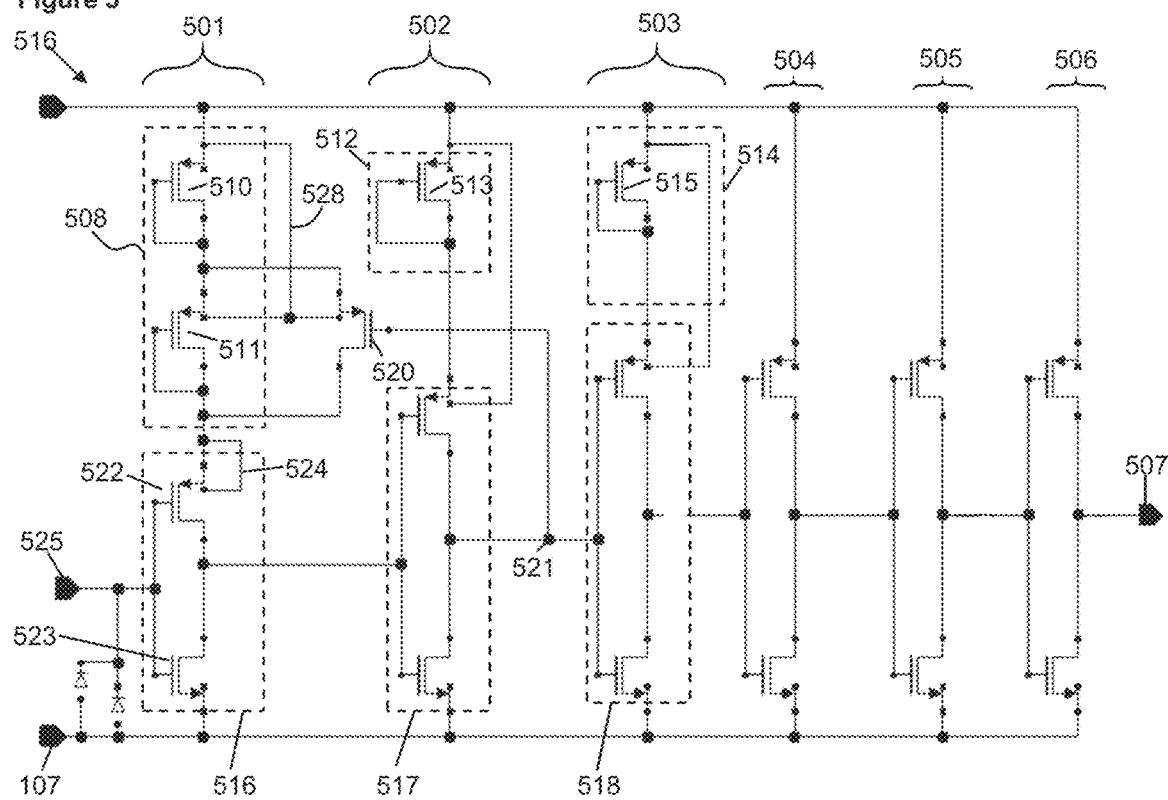
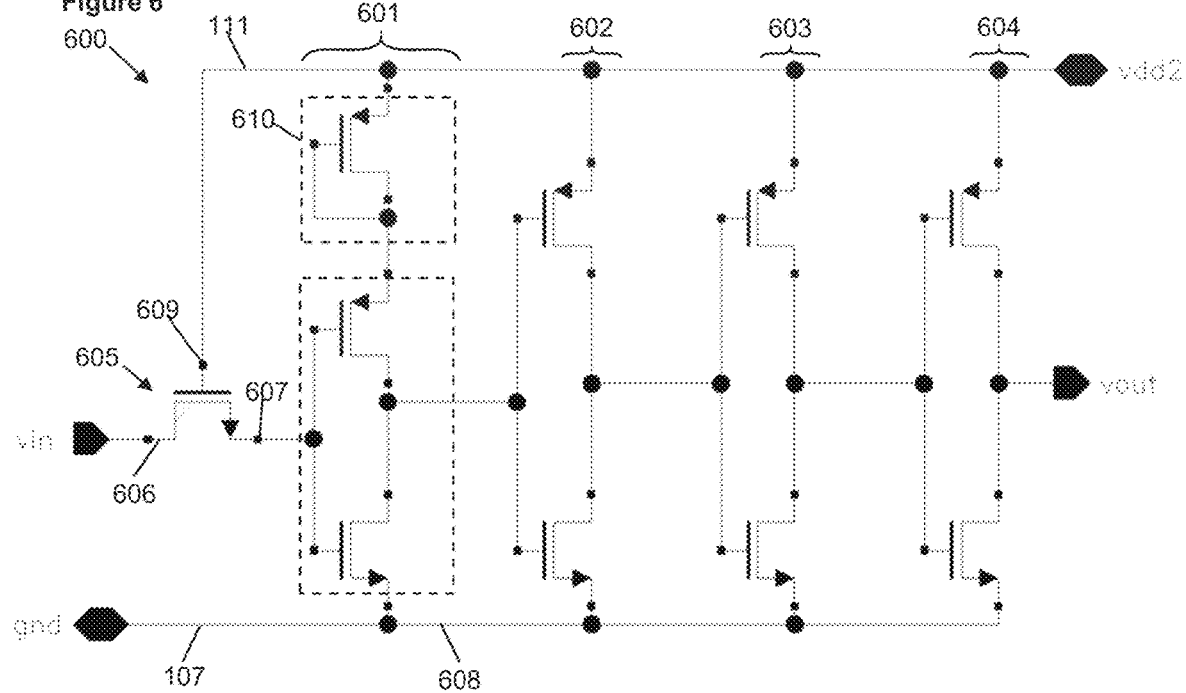

APPARATUS INCLUDING A LEVEL SHIFTER

CROSS-REFERENCE TO RELATED APPLICATIONS

This application claims the priority under 35 U.S.C. § 119 of European Patent application no. 19205442.7, filed on 25 Oct. 2019, the contents of which are incorporated by reference herein.

FIELD

The present disclosure relates to an apparatus having circuit components that operate in different voltage domains. In particular, it relates to an apparatus having a level shifter for receiving a digital signal from one voltage domain and shifting its voltage levels for control of a second voltage domain.

BACKGROUND

Circuit arrangements may have one or more components that operate in a first supply voltage domain and one or more components that operate in a second supply voltage domain, different to the first, Ensuring that a digital signal can cross from the first supply voltage domain to the second supply voltage domain while ensuring operation of the components in the domains within desired operating parameters may be difficult.

SUMMARY

According to a first aspect of the present disclosure there is provided an apparatus comprising:
- a first voltage domain circuit including a first circuit component configured to provide a first digital output signal, wherein the first voltage domain circuit is configured to receive a first supply voltage and wherein the first digital output signal has high and low states and the voltage of the high state is based on the first supply voltage;
- a second voltage domain circuit comprising a second circuit component, wherein the second voltage domain circuit is configured to receive a second supply voltage that is greater than the first supply voltage;
- a level shifter arrangement configured to receive the first digital output signal and generate a second digital output signal based on the first digital output signal with an increased voltage level of the high state, wherein the level shifter arrangement is configured to provide said second digital output signal for input to the second circuit component;
- wherein the level shifter arrangement comprises at least one stage, the at least one stage comprising an arrangement of one or more diode-connected PMOS transistors, a source terminal of at least one of said one or more diode-connected PMOS transistors configured to couple to the second supply voltage and a drain terminal of at least one of said one or more diode-connected PMOS transistors coupled to a CMOS inverter arrangement, the CMOS inverter arrangement having a first terminal coupled to said drain terminal and a voltage reference terminal for coupling to a voltage reference;
- the CMOS inverter arrangement of a first of the at least one stages configured to receive the first digital output signal and the CMOS inverter arrangement of a final stage of the at least one stages configured to output said second digital output signal.

In one or more examples, the one or more CMOS invertor arrangements of the level shifter comprises a PMOS transistor wherein the first terminal comprises the source terminal of said PMOS transistor, a drain terminal connected, directly or indirectly, to a drain terminal of an NMOS transistor and wherein the source terminal of the NMOS transistor is for coupling, directly or indirectly, to the reference voltage, the CMOS inverter arrangement having an input comprising the gate terminals of both the PMOS and NMOS transistors and an output comprising a node between the drain terminal of the PMOS transistor and the drain terminal of the NMOS transistor.

In one or more examples, the CMOS inverter arrangement of the final stage of the at least one stages is configured to output said second digital output signal from a node between a PMOS and an NMOS transistor of the CMOS inverter arrangement.

In one or more examples, the CMOS inverter arrangement of any stage preceding the final stage is configured to provide an output from a node between a PMOS and an NMOS transistor of the CMOS inverter arrangement.

In one or more embodiments, the level shifter arrangement comprises at least two stages comprising a first stage and a second stage;
- wherein the first stage comprising a first arrangement of one or more diode-connected PMOS transistors, a source terminal of at least one of said one or more diode-connected PMOS transistor configured to couple to the second supply voltage and a drain terminal of at least one of said one or more diode-connected PMOS transistors coupled to a first CMOS inverter arrangement, the first CMOS inverter arrangement having a first terminal coupled to said drain terminal and a voltage reference terminal for coupling to a voltage reference; and
- wherein the second stage comprises a second arrangement of one or more diode-connected PMOS transistors, a source terminal of at least one of said one or more diode-connected PMOS transistors configured for coupling to the second supply voltage and a drain terminal of at least one of said one or more diode-connected PMOS transistors coupled to a second CMOS inverter arrangement, the second CMOS inverter arrangement having a first terminal coupled to said drain terminal and a voltage reference terminal for coupling to a voltage reference;
- wherein the first CMOS inverter arrangement is configured to receive the first digital output signal and provide a first intermediate digital output signal to the second CMOS inverter arrangement of the second stage, wherein the second CMOS inverter arrangement is configured to receive the intermediate digital output signal and provide the second digital output signal for the second circuit component; and
- wherein the first and second arrangements of diode-connected PMOS transistors are configured such that that a voltage drop provided by the first arrangement is greater than the voltage drop provided by the second arrangement.

In one or more examples, the level shifter arrangement comprises, following the at least one stage, at least one additional stage comprising a CMOS inverter arrangement without an arrangement of one or more diode-connected PMOS transistors, the CMOS invertor arrangement of the additional stage comprising a PMOS transistor having a source terminal for coupling to receive the second supply voltage, a drain terminal connected, directly or indirectly, to a drain terminal of an NMOS transistor and wherein the source terminal of the NMOS transistor is for coupling, directly or indirectly, to the reference voltage, the CMOS inverter arrangement of the additional stage having an input comprising the gate terminals of both the PMOS and NMOS transistors and an output comprising a node between the drain terminal of the PMOS transistor and the drain terminal of the NMOS transistor.

In one or more examples, the first intermediate output signal is output from a node between a PMOS and an NMOS transistor of the CMOS inverter arrangement.

In one or more examples, there are an even number of stages. In one or more examples, each stage is configured to, by the arrangement of one or more diode-connected PMOS transistors in each stage, shift up a trip voltage level of the CMOS inverter arrangement of the respective stage relative to the CMOS inverter arrangement of a preceding stage, towards the second supply voltage.

In one or more embodiments, the arrangement of one or more diode-connected PMOS transistors comprises one of:
a plurality of diode-connected PMOS transistors connected in series; and
a plurality of diode-connected PMOS transistors connected in parallel.

In one or more embodiments, the arrangement comprises a plurality of diode-connected PMOS transistors connected in series and wherein at least one or more of the diode-connected PMOS transistors have a separate n-well.

In one or more embodiments, the first arrangement comprises a plurality of diode-connected PMOS transistors connected in series and the second arrangement comprises one or more diode-connected PMOS transistors connected in series and said difference in voltage drop is provided by a greater number of diode-connected PMOS transistors connected in series in the first arrangement relative to the number of diode-connected PMOS transistors connected in series in the second arrangement.

In one or more embodiments, the first arrangement comprises one or more diode-connected PMOS transistors connected in parallel and the second arrangement comprises a plurality of diode-connected PMOS transistors connected in parallel and said difference in voltage drop is provided by a greater number of diode-connected PMOS transistors connected in parallel in the second arrangement relative to the number of diode-connected PMOS transistors connected in parallel in the first arrangement.

In general, and in one or more examples, each arrangement of one or more diode-connected PMOS transistors of each stage comprises a chain of diode-connected PMOS transistors wherein a first diode-connected PMOS transistor in the chain or a first parallel connected plurality of diode-connected PMOS transistors in the chain have a source terminal/terminals for coupling to the second supply voltage and a drain terminal/terminals for coupling to zero, one or more subsequent diode-connected PMOS transistors in the chain or subsequent parallel connected plurality of diode-connected PMOS transistors in the chain prior to the connection to the first terminal of the CMOS inverter arrangement.

In one or more embodiments, the level shifter arrangement comprises at least three stages and the voltage drop of the diode-connected PMOS transistor arrangements of each stage of the at least three stages incrementally and monotonically decreases from the first stage that receives the first digital output signal to a final stage of the at least three stages that provides the second digital output signal for the second circuit component.

In one or more embodiments, each of the diode-connected PMOS transistors of the first arrangement and the second arrangement have a same, unit size.

In one or more embodiments, the level shifter arrangement comprises:
a high-trigger-level first stage comprising said arrangement of one or more diode-connected PMOS transistors, a source terminal of at least one of said one or more diode-connected PMOS transistors configured to couple to the second supply voltage and a drain terminal of at least one of said one or more diode-connected PMOS transistors coupled to a high-trigger-level CMOS inverter arrangement, the high-trigger-level CMOS inverter arrangement having a first terminal coupled to said drain terminal and a voltage reference terminal for coupling to a voltage reference;
the high-trigger-level CMOS inverter arrangement of the high-trigger-level first stage configured to receive the first digital output signal and provide a high-trigger-level output signal;
a low-trigger-level first stage comprising an arrangement of one or more diode-connected PMOS transistors, a source terminal of at least one of said one or more diode-connected PMOS transistors configured to couple to the second supply voltage and a drain terminal of at least one of said one or more diode-connected PMOS transistors coupled to a low-trigger-level CMOS inverter arrangement, the low-trigger-level CMOS inverter arrangement having a first terminal coupled to said drain terminal and a voltage reference terminal for coupling to a voltage reference;
the low-trigger-level CMOS inverter arrangement of the low-trigger-level first stage also configured to receive the first digital output signal and provide a low-trigger-level output signal;
wherein the high-trigger-level and the low-trigger-level CMOS invertor arrangements both comprises a PMOS transistor having a source terminal for coupling, directly or indirectly, to the respective arrangement of one or more diode-connected PMOS transistors, and a drain terminal connected, directly or indirectly, to a drain terminal of an NMOS transistor and wherein the source terminal of the NMOS transistor is for coupling, directly or indirectly, to the reference voltage;
wherein in the high-trigger-level CMOS inverter arrangement the width-length ratio of the PMOS transistor is greater than the NMOS transistor and in the low-trigger-level CMOS inverter arrangement the width-length ratio of the NMOS transistor is greater than the PMOS transistor;
a latch configured to receive the high-trigger-level output signal and the low-trigger-level output signal and combine them to generate a combined digital signal; and
a final stage comprising a CMOS logic inverter configured to receive the combined digital signal and output the second digital signal.

In one or more embodiments, the first stage includes a switch, the switch configured to short one of the diode-connected PMOS transistors of the first arrangement, the switch controlled by the output of the second stage.

In one or more embodiments, the switch comprises a transistor having its source terminal and drain terminal coupled to short said one of the diode-connected PMOS transistors of the first arrangement and its gate terminal coupled to the second CMOS inverter arrangement to receive the second digital output signal.

In one or more embodiments, the first CMOS invertor arrangement comprises a PMOS transistor connected in series with a NMOS transistor, and wherein the PMOS transistor of the first CMOS invertor arrangement has a connection between its source terminal and its back-gate terminal.

In one or more embodiments, the level shifter arrangement includes an NMOS transistor for high-voltage protection, said NMOS transistor having a drain terminal for receiving the first digital output signal and a source terminal for providing the first digital output signal to the CMOS inverter arrangement of a first of the at least one stages, wherein the gate of the NMOS transistor for high-voltage protection is coupled to receive the second supply voltage.

In one or more embodiments, said NMOS transistor for high-voltage protection comprises a double-diffused metal-oxide-semiconductor, DMOS, transistor.

According to a second aspect of the present disclosure there is provided a wireless communication device including the apparatus of any preceding claim. The wireless communication device may comprise part of a communication device, such as a mobile telephone or base station.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which:

FIG. 5 shows a fourth example embodiment based on the arrangements of either of FIG. 2 and FIG. 3 with an alternative arrangement for implementing hysteresis without separate stages;

FIG. 6 shows a fifth example embodiment illustrating the addition of high voltage protection that may be applied in any other embodiment;

DETAILED DESCRIPTION

In some electronic devices it is necessary for digital signalling to cross from a first supply domain to a second supply domain. Accordingly, the digital signalling generated by a first circuit component that is powered by the first supply domain needs to be effectively received by a second digital circuit component that is powered by the second supply domain. It may also be important that the voltage levels of the digital signalling does not cause undesirable behaviour of the second circuit component. Put another way, it may be desirable that the voltage levels of the digital signalling is complementary to logic high and/or logic low trigger levels of digital logic of the second circuit component.

Figure 1:
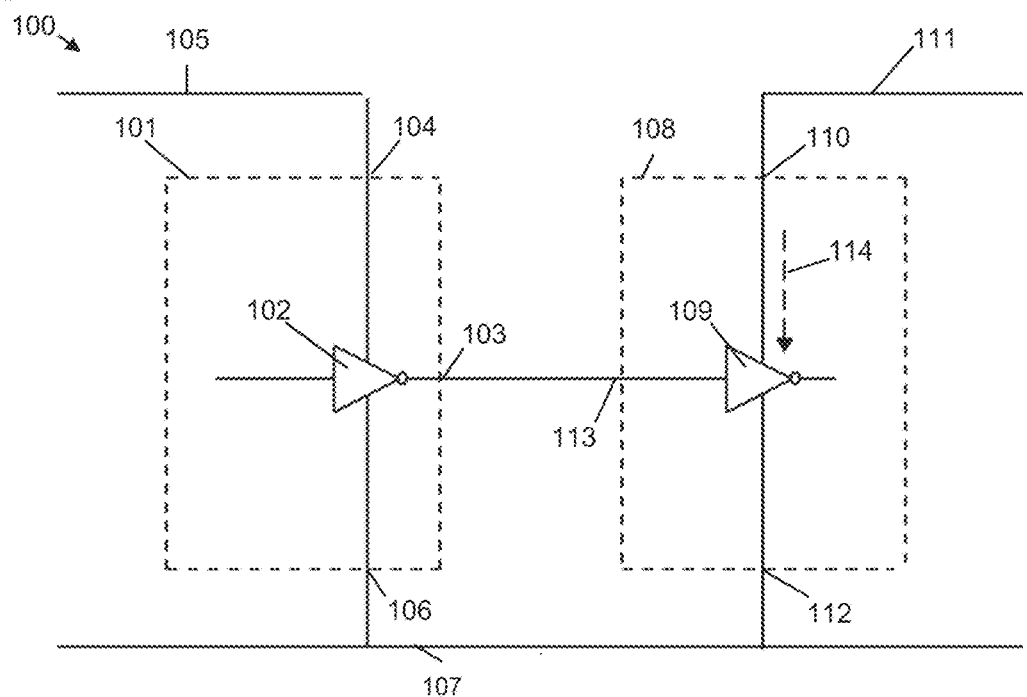
FIG. 1 shows an example embodiment of a first voltage domain circuit and a second voltage domain circuit and a first digital output signal to be passed between them.

FIG. 1 shows an apparatus 100 comprising a first voltage domain circuit 101 including a first circuit component 102 configured to provide a first digital output signal at an output terminal 103. The first voltage domain circuit 101 includes a voltage supply terminal 104 to receive a first supply voltage from supply line 105 and a voltage reference terminal 106 for coupling to a reference voltage, such as ground, on line 107. The first circuit component 102 comprises a digital logic component, which in this example is shown as a logic inverter. It will be appreciated that the first circuit component 102 may comprise any single digital logic component or an arrangement of a plurality of digital logic components (e.g. AND, OR, NOT, NOR etc or combinations thereof). In one or more examples, the first circuit component 102 comprises a CMOS based digital logic component. As will be understood, the first digital output signal provided at output terminal 103 has high and low states and the voltage of the high state is based on (such as substantially equal to) the first supply voltage. Thus, while the first circuit component 102 may be configured to generate logic high and logic low signals using the first supply voltage, there may be losses and voltage drops across the logic. Accordingly, the first digital output signal has a logic high and logic low states that have voltages dependent on the first supply voltage of the first supply domain circuit 101.

FIG. 1 also shows a second voltage domain circuit 108 comprising a second circuit component 109. The second voltage domain circuit 108 includes a voltage supply terminal 110 to receive a second supply voltage from supply line 111 and a voltage reference terminal 112 for coupling to a reference voltage, such as ground, on line 107. The second circuit component 109 comprises a digital logic component, which in this example is shown as a logic inverter. In one or more examples, the first circuit component 109 comprises a CMOS based digital logic component. It will be appreciated that the second circuit component 109 may comprise any single digital logic component or an arrangement of a plurality of digital logic components (e.g. AND, OR, NOT, NOR etc or combinations thereof). The second voltage domain circuit 108 comprises an input terminal 113 to receive the first digital output signal. The second circuit component 109 may be configured to operate based on a logic high or a logic low received at the input terminal 113. The second supply voltage configured to power the digital logic of the second circuit component 109 is greater than the first supply voltage that powers the digital logic of the first circuit component 102, Accordingly, there may be a disparity between the voltage range that is considered logic high in the first voltage domain circuit 101 compared to the voltage range that is considered logic high in the second voltage domain circuit 108. An undesirable consequence of such a disparity may be, in one or more examples, the occurrence of a cross-current shown by arrow 114 through the digital logic of the second circuit component 109 from the second voltage supply to ground.

In general, the second circuit component 109 comprises an arrangement of one or more transistors configured to form a digital logic circuit, such as the aforementioned logic inverter. The logic inverter may comprise a PMOS transistor having a source terminal for coupling, directly or indirectly, to the second supply voltage, a drain terminal connected, directly or indirectly, to a drain terminal of an NMOS transistor and wherein the source terminal of the NMOS transistor is for coupling, directly or indirectly, to the reference voltage, wherein the first circuit component is configured to provide the first digital output signal to the gate terminals of both the PMOS transistor and the NMOS transistor and an output signal of the second circuit component is provided from a node between the drain terminal of the PMOS transistor and the drain terminal of the NMOS transistor.

In general, the first circuit component 102 comprises an arrangement of one or more transistors configured to form a digital logic circuit, such as the aforementioned logic inverter. The logic inverter may comprise a PMOS transistor having a source terminal for coupling, directly or indirectly, to the first supply voltage, a drain terminal connected, directly or indirectly, to a drain terminal of an NMOS transistor and wherein the source terminal of the NMOS transistor is for coupling, directly or indirectly, to the reference voltage, wherein the first circuit component is configured to provide the first digital output signal from a node between the drain terminal of the PMOS transistor and the drain terminal of the NMOS transistor.

Figure 2:
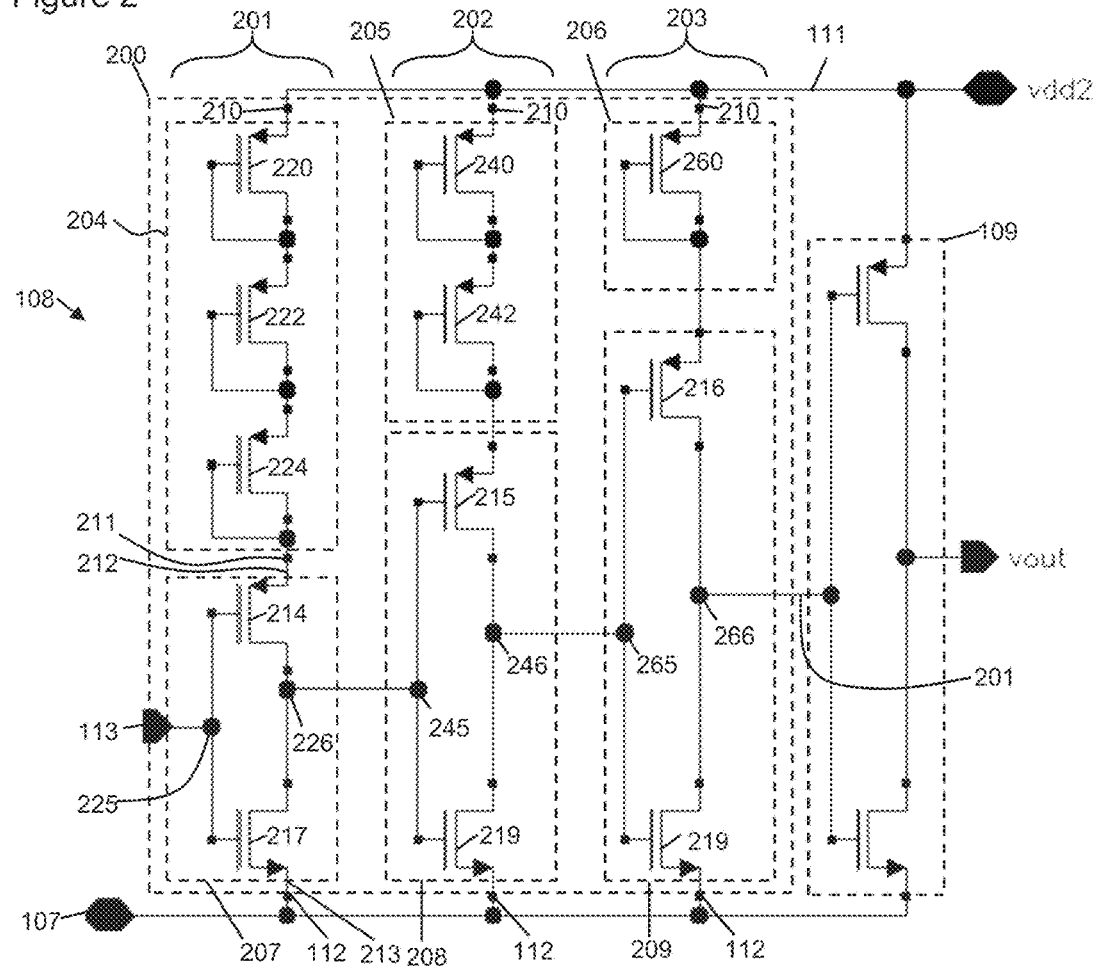
FIG. 2 shows a first example embodiment illustrating the use of a first example arrangement of diode-connected PMOS transistors to receive the first digital output signal.

FIG. 2 shows the second voltage domain circuit 108 in more detail and comprises a first example embodiment in which the second voltage domain circuit 108 includes a level shifter arrangement 200. The level shifter arrangement 200 is configured to receive the first digital output signal at input terminal 113 and provide or generate a second digital output signal at output 201 for receipt by the second circuit component 109. The second circuit component 109 is shows as a CMOS inverter arrangement. The second digital output signal may be considered a modified version of the first digital output signal.

The second digital output signal is based on the first digital output signal in terms of the data content of logic high and logic low signals being reproduced but the voltage levels representing the logic high and logic low may be different in the second digital output signal. In particular, the second digital output signal may have an increased (e.g. average) voltage level of the high state compared to the (e.g. average) voltage level of the high state in the first digital output signal.

The level shifter arrangement 200 may therefore be configured to provide said second digital output signal for input to the second circuit component 109 and can, in one or more examples, overcome or reduce the occurrence of the cross-current 114.

The level shifter arrangement 200 comprises at least one stage. In example FIG. 2, three stages are shown 201, 202 and 203. A first of the one or more stages 201, 202 and 203, which in this example comprises first stage 201, is configured to receive the first digital output signal from input terminal 113. The first digital output signal is then passed from stage to stage sequentially, i.e. to the second stage 202 from the first stage 201 wherein it may be termed a first intermediate digital output signal, and to the third stage 203 from the second stage first where it may be termed a second intermediate digital output signal, and the second digital output signal is output from a final stage of the one or more stages 201, 202 and 203, which in this example comprises the third stage 203. It will be appreciated that in examples wherein the level shifter arrangement 200 comprises a single stage, the first and the final stage comprise the same, single stage.

In general, each of the stages 201, 202, 203 comprise a similar structure in that they comprise an arrangement 204, 205, 206 of one or more diode-connected PMOS transistors and a CMOS inverter arrangement 207, 208, 209 coupled in series between the voltage supply terminal 110 and a voltage reference terminal 112. Thus, in one or more examples, a source terminal 210 of one of said one or more diode-connected PMOS transistors, termed the first diode-connected PMOS transistor, 220, 240 or 260, is coupled to receive the second supply voltage from supply line 111. In one or more examples, a drain terminal 211 of one of said one or more diode-connected PMOS transistors, termed the final diode-connected PMOS transistor, 224, 242 or 260 is coupled to the respective CMOS inverter arrangement 207, 208, 209. Thus, the CMOS inverter arrangement 207, 208, 209 has a first terminal 212 coupled to said drain terminal 211 and a second terminal 213 coupled to the voltage reference terminal 112 to receive the reference voltage.

In one or more examples, it is the CMOS inverter arrangement 207 of the first stage 201 which receives the first digital output signal from input terminal 113. The first digital output signal is then passed between the CMOS inverter arrangements 207, 208, 209 of each stage to the final CMOS inverter arrangement 209 of the third stage 203 and the second digital output signal is output thereby.

In one or more examples, the CMOS invertor arrangements 207, 208, 209 of each stage 201, 202, 203 of the level shifter 200 comprises a PMOS transistor, 214, 215, or 216, and an NMOS transistor 217, 218 or 219 coupled by their respective drain terminals. The first terminal 212 comprises the source terminal of said PMOS transistor 214, 215, or 216 and the second terminal 213 comprises the source terminal of the NMOS transistor 217, 218 or 219.

The CMOS inverter arrangements 207, 208, 209 each have an input 225, 245, 265 for receiving the first digital signal from the input terminal 113 or a preceding stage 201, 202, 203. The inputs 225, 245, 265 branch to couple to gate terminals of both the PMOS 214, 215, or 216 and NMOS transistors 217, 218 or 219 of the respective CMOS invertor arrangement. The CMOS inverter arrangements 207, 208, 209 have an output 226, 246, 266 comprising a node between the drain terminal of the respective PMOS transistor 214, 215, or 216 and the drain terminal of the respective NMOS transistor 217, 218 or 219.

Thus, in general, the CMOS inverter arrangements 207 comprise drain terminal connected PMOS and NMOS transistors and a first 201 of the at least one stages is configured to receive the first digital output signal at gate terminals of said PMOS and NMOS transistors. The CMOS inverter arrangement 209 of the final stage 203 of the at least one stages is configured to output said second digital output signal from the output 266 comprising a node between the PMOS 216 and NMOS transistor 219 of the CMOS inverter arrangement.

Turning now to the arrangements 204, 205, 206 of one or more diode-connected PMOS transistors, the diode-connected PMOS transistors comprises, as will be understood by those skilled in the art, p-channel MOSFETs having a connection between a gate terminal thereof and a drain terminal thereof. The arrangements 204, 205, 206, in general, each comprises a chain of diode-connected PMOS transistors wherein a first diode-connected PMOS transistor in the chain has a source terminal for coupling to the second supply voltage and a drain terminal for coupling to zero, one or more subsequent diode-connected PMOS transistors in the chain prior to the connection to the first terminal 212 of the respective CMOS inverter arrangement. It will be appreciated that in other examples, the arrangements 204, 205, 206 may have additional connections, such as from the second supply 111, and/or may have other components coupled thereto.

The first arrangement 204 of diode-connected PMOS transistors comprises three series connected diode-connected PMOS transistors 220, 222, 224. The second arrangement 205 of diode-connected PMOS transistors comprises two series connected diode-connected PMOS transistors 240, 242. The third arrangement 206 of diode-connected PMOS transistors comprises one diode-connected PMOS transistor 260.

In one or more examples, the first and second arrangements 204, 205 of diode-connected PMOS transistors are configured such that that a voltage drop provided by the first arrangement 204 is greater than the voltage drop provided by the second arrangement 205. Likewise, the second and third arrangements 205, 206 of diode-connected PMOS transistors may be configured such that that a voltage drop provided by the second arrangement 205 is greater than the voltage drop provided by the third arrangement 206.

In this example, said difference in voltage drop is provided by a greater number of diode-connected PMOS transistors 220, 222, 224 (three) connected in series in the first arrangement 204 relative to the number of diode-connected PMOS transistors 240, 242 (two) connected in series in the second arrangement 205. Similarly, said difference in voltage drop is provided by a greater number of diode-connected PMOS transistors 240, 242 (two) connected in series in the second arrangement 205 relative to the number of diode-connected PMOS transistors 260 (one) connected in series in the third arrangement 206.

By using the arrangements 204, 205, 206 of diode-connected PMOS transistors on top of the respective CMOS inverter arrangements 207, 208, 209 the stages effectively lower the CMOS inverter arrangement's supply voltage by a threshold voltage (e.g. $V_{th}$, for each diode-connected PMOS transistor used in said stage), and hence the trip voltage level of the CMOS inverter arrangement. It will be appreciated that the trip voltage level is a property of a CMOS inverter arrangement defining the point where it switches states. The different stages 201, 202, 203 thereby gradually shift up the supply voltage. This "diode based tapering" may be used to perform level-shifting from the lower supply domain 101 to the higher supply domain 108. In one or more examples, each stage is configured to, by the arrangement of one or more diode-connected PMOS transistors in each stage, shift up a trip voltage level of the CMOS inverter arrangement of the respective stage relative to the CMOS inverter arrangement of a preceding stage, towards the second supply voltage. This arrangement may also reduce DC currents in at least the second circuit component. The one or more arrangements of diode connected PMOS arranged in a tapered fashion reduce the effective local voltage across each respective CMOS inverter arrangement and may thereby reduce or minimize the static current consumption.

The embodiment of FIG. 2 shows "series tapering". The number of diode-connected PMOS transistors required to transition from first supply voltage at input 113 to the second supply voltage of the second circuit 108 may be determined by dividing the voltage difference (i.e. first supply voltage—second supply voltage) by a threshold voltage comprising, as will be known to those skilled in the art, the voltage at which the inversion layer of the diode-connected PMOS transistor forms or, put another way, the voltage at which the transistor switches on.

In one or more examples, two or more of the diode-connected PMOS transistors may have a separate n-well. This has been found to reduce the body effect. The use of separate n-wells can be employed to lower the threshold voltage of the diode-connected PMOS transistors of the respective arrangements 204, 205, 206, thereby shifting-up the trip voltage level of the respective CMOS inverter arrangement 207, 208, 209. It will be appreciated that the voltage present between n-well and source terminal influences the threshold voltage and thereby the trip voltage level (in combination with a width/length dimensioning of the diode-connected PMOS transistor).

In one or more examples, there are an even number of stages. In one or more examples, there are an odd number of stages.

The use of arrangements of diode-connected PMOS transistors may be advantageous as the arrangement may not suffer from the body effect. For example, a large Vgs voltage may occur if, alternatively, an NMOS transistor is used. Further, the level shifter of this or any other embodiment may only require the second supply voltage thereby simplifying the layout.

In the example of FIG. 2, the arrangement(s) 204, 205, 206 of diode-connected PMOS transistors comprises series connected diode-connected PMOS transistors. The example embodiment of FIG. 3 shows the arrangement of diode-connected PMOS transistors as comprising parallel connected diode-connected PMOS transistors.

Figure 3:
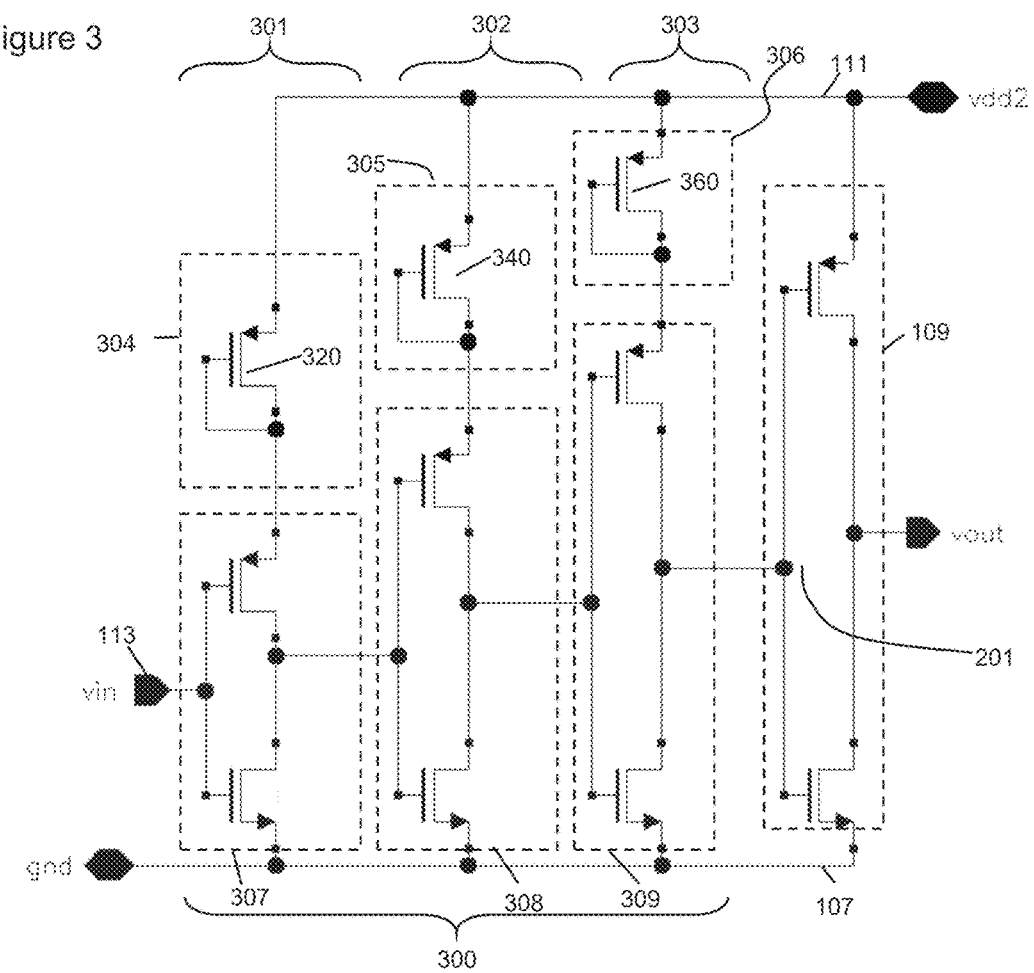
FIG. 3 shows a second example embodiment illustrating the use of a second example arrangement of diode-connected PMOS transistors to receive the first digital output signal.

Example FIG. 3 shows a level shifter 300 having three stages similar to FIG. 2; a first stage 301, a second stage 302 and a third stage 303. Similar to example FIG. 2, the first stage comprises a first arrangement 304 of diode-connected PMOS transistors connected to a CMOS inverter arrangement 307 in series between the second voltage supply 111 and the reference voltage 107. The second stage comprises a second arrangement 302 of diode-connected PMOS transistors connected to a second CMOS inverter arrangement 308 in series between the second voltage supply 111 and the reference voltage 107. The third and final stage comprises a third arrangement 306 of diode-connected PMOS transistors connected to a CMOS inverter arrangement 309 in series between the second voltage supply 111 and the reference voltage 107. As in the previous example, the first CMOS inverter arrangement 307 receives the first digital output signal from input 113 and the final CMOS inverter arrangement 308 outputs the second digital control signal at output 201 to the second circuit component 109. The structure and operation of the CMOS inverter arrangements 307, 308 and 309 is the same as the previous example embodiment.

In example FIG. 3 the arrangements 304, 305 and 306 differ from the example FIG. 2. Each arrangement 304, 305

306 has a different number of diode-connected PMOS transistors connected in parallel. In particular, a later stage has a greater number of diode-connected PMOS transistors connected in parallel than a preceding stage. These differently sized parallel arrangements therefore have different current capabilities and therefore the voltage drop across them can be tapered across the stages 301, 302, 303. In one or more examples, the first and second arrangements 304, 305 are configured such that the voltage drop provided by the first arrangement 204 is greater than the voltage drop provided by the second arrangement 205. Likewise, the second and third arrangements 205, 206 are configured such that that a voltage drop provided by the second arrangement 205 is greater than the voltage drop provided by the third arrangement 206.

In the example FIG. 3 it will be appreciated that the source terminals of the parallel-connected group of diode-connected PMOS transistors will be configured to couple to the supply line 111. Likewise, the drain terminals of the parallel connected group of diode-connected PMOS transistors will be configured to couple to the first terminal of the respective CMOS inverter arrangement 307, 308, 309.

Using multiple diode-connected PMOS transistors in parallel effectively multiplies the width, and hence the total current capability of the diode-connected PMOS transistors. This in turn will lower the required over-drive voltage, such that the trip level of the CMOS inverter arrangement of the respective stage will shift up. It will be appreciated by those skilled in the art that the over-drive voltage comprises the additional voltage (over-drive voltage) over the threshold voltage required to sustain a predetermined amount of current.

In example FIG. 3, the CMOS inverter arrangements 307, 308, 309 of each stage make use of different sized diode-connected PMOS arrangements 304, 305, 306 by using a unit-sized diode-connected PMOS transistor, e.g. Width (W)/Length (L)=1/5, and placing multiple diode-connected PMOS transistors in parallel. In the present example, the first arrangement 304 may comprise one diode-connected PMOS transistor with a W/L ratio of 1/5. Accordingly, diode-connected PMOS transistor 320 is representative of a single unit sized diode-connected PMOS transistor. The second arrangement 305 can be constructed from five unit-sized (W/L ratio of 1/5) diode-connected PMOS transistor in parallel. Accordingly, the diode-connected PMOS transistor 340 is representative of a parallel connected group of five unit sized diode-connected PMOS transistors. The third arrangement 306 can be constructed from twenty-five unit-sized (W/L ratio of 1/5) diode-connected PMOS transistor in parallel. Accordingly, the diode-connected PMOS transistor 360 is representative of a parallel connected group of twenty-five unit sized diode-connected PMOS transistors. Using unit-sized PMOST Diodes may allow for a simplification of backend layout design. It will be appreciated that different numbers of parallel-connected diode-connected PMOS transistors may be used in other examples. While in this example, the parallel connected arrangements 304, 305, 306 are embodied by different numbers of parallel connected diode-connected PMOS transistors, it will be appreciated that it may be equivalent to provide arrangements having increasing W/L ratios from the first stage 301 to each subsequent stage 302, 303.

In one or more examples, the level shifter 200, 300 may comprise different combinations of parallel connected groups of diode-connected PMOS transistors as well as chains of series connected diode-connected PMOS transistors. Whichever layout of diode-connected PMOS transistors is used in each of the arrangements 204, 205, 206, 304, 305, 306 the arrangements may be selected to provide a decreasing voltage drop and an increasing trip voltage level for the associated CMOS inverter arrangement across the stages 201, 202, 203.

The principles of the first and second example embodiments may be applied in further embodiments. The example embodiment of FIG. 4 comprises an example that adds hysteresis. Hysteresis is usually added to an input buffer of a digital logic circuit to suppress glitches caused by noise superimposed on a signal that is slowly changing.

To implement hysteresis, two different levels are required, whereby a first level defines the transition from low to high state and another level defines the transition from high to low state wherein the hysteresis comprises the difference. These levels can be implemented using two separate CMOS inverter arrangements that are both connected to receive the first digital signal.

Figure 4:
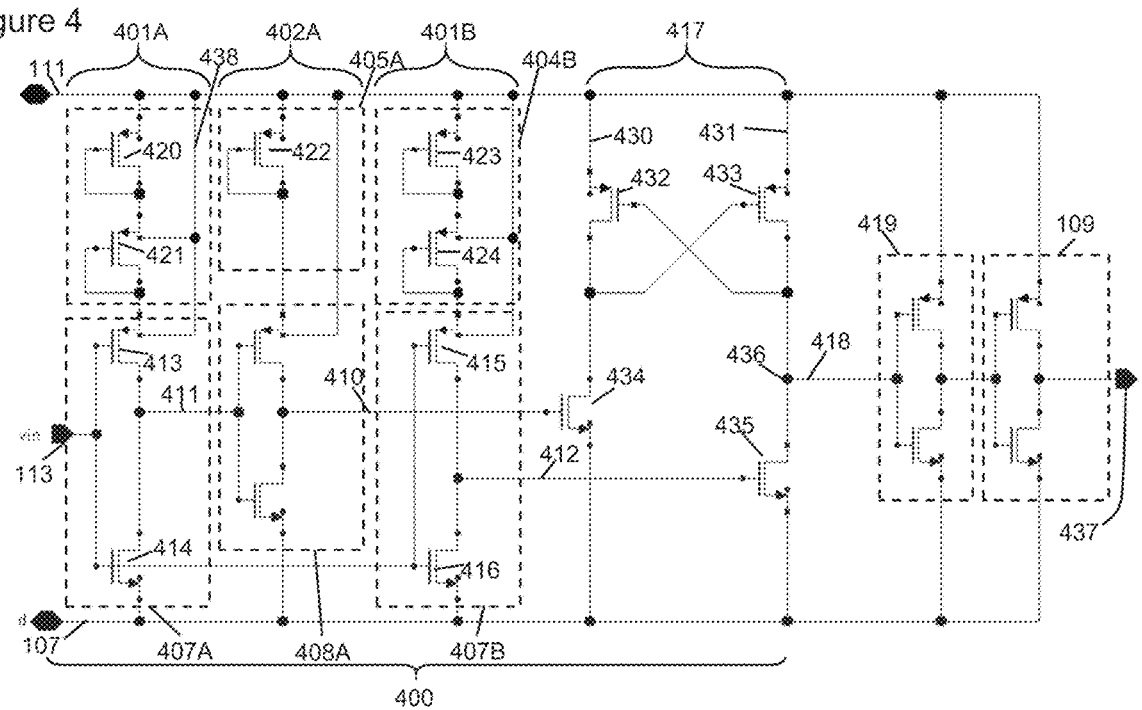
FIG. 4 shows a third example embodiment based on the arrangements of either of FIG. 2 and FIG. 3 with additional stages for implementing hysteresis.

The level shifter arrangement 400 of example FIG. 4 comprises two first stages 401A and 401B. The two first stages comprise a high-trigger-level first stage 401A and a low-trigger-level first stage 401B. In this example, there is a second stage 402A for the high-trigger-level first stage 401A. There is no second stage associated with the low-trigger-level first stage 401B, However, in other embodiments the high-trigger-level stage(s) may have at least one, two or more stages and the low-trigger-level stage(s) may have at least one, two or more stages.

The high-trigger-level first stage 401A comprises an arrangement 404A of one or more diode-connected PMOS (DPMOS) transistors, comprising a first and second series-connected DPMOS 420, 421 in this example (although other arrangements are possible). A source terminal of the first DPMOS 420 is configured to couple to the second supply voltage and a drain terminal of the second DPMOS transistor 421 is coupled to a high-trigger-level CMOS inverter arrangement 407A. As in previous examples, the high-trigger-level CMOS inverter arrangement 407A has a first terminal coupled to said drain terminal of the second DPMOS 421 and a voltage reference terminal for coupling to a voltage reference line 107. The high-trigger-level CMOS inverter arrangement 407A of the high-trigger-level first stage 401A is configured to receive the first digital output signal from input terminal 113 and provide a high-trigger-level output signal at 410. In accordance with the principles herein, there may comprises one or more stages through which the first digital output signal passes before it becomes the second digital output signal that is provided for the second component 109.

In this example, the high-trigger-level CMOS inverter arrangement 407A of the high-trigger-level first stage 401A provides an intermediate high-trigger-level signal at 411 which is passed to a second high-trigger-level CMOS inverter arrangement 408A of the second high-trigger-level stage 402A. It is therefore the second high-trigger-level CMOS inverter arrangement 408A that outputs the high-trigger-level output signal at 410.

The level shifter 400 includes the low-trigger-level first stage 401B which comprises, as is consistent with all of the embodiments, an arrangement 404B of one or more DPMOS transistors 422 and a low-trigger-level CMOS inverter arrangement 407B. A source terminal of the DPMOS transistor 422 is configured to couple to the second supply voltage 111 and a drain terminal of the DPMOS transistor 422 (because there is only one in this stage rather than a chain of two or more) is coupled to the low-trigger-level CMOS inverter arrangement 407B. The low-trigger-level CMOS inverter arrangement 407B has a first terminal coupled to said drain terminal and a voltage reference terminal for coupling to a voltage reference.

The low-trigger-level CMOS inverter arrangement 407B of the low-trigger-level first stage 401B is also configured to receive the first digital output signal from input 113 and provide, as output, a low-trigger-level output signal at 412.

The high-trigger-level and the low-trigger-level CMOS invertor arrangements 407A, 408A, 407B may each comprise a PMOS transistor 413, 415 having a source terminal for coupling, directly or indirectly, to the respective arrangement 404A, 405A, 404B of one or more DPMOS transistors, and a drain terminal connected, directly or indirectly, to a drain terminal of an NMOS transistor 414, 416 and wherein the source terminal of the NMOS transistor is for coupling, directly or indirectly, to the reference voltage at 107. As in previous examples, the input to the high-trigger-level and the low-trigger-level CMOS invertor arrangements 407A, 408A, 407B may comprise the gate terminals of the constituent PMOS and NMOS transistors and the output comprises a node between the connected drain terminals.

In the high-trigger-level CMOS inverter arrangement 407A of at least the first stage 401A the PMOS transistor 413 has a width-length ratio (e.g. 10/1) that is greater than the width-length ratio (e.g. 2/2) of the NMOS transistor 414. Thus, the PMOS 413 may be considered strong while the NMOS 414 may be considered weak.

In the low-trigger-level CMOS inverter arrangement 407B the width-length ratio of the NMOS transistor 416 (e.g. 10/1) is greater than the width-length ratio (e.g. 2/2) of the PMOS transistor 415. Thus, the PMOS 415 may be considered weak while the NMOS 416 may be considered strong.

The difference in strength between the PMOS and NMOS in the low-trigger-level CMOS inverter arrangement 407B and the high-trigger-level CMOS inverter arrangement 407A provides the different trip voltage levels for implementing hysteresis. In addition, the DPMOS transistors of the arrangements 404A and 404B may be scaled differently to support the different trigger levels. Thus the width-length ratio of the DPMOS transistors of the arrangement 404A may be greater than the width-length ratio of the DPMOS transistors of the arrangement 404B.

The level shifter 400 further comprises a latch 417 to combine the high-trigger-level output signal at 410 with the low-trigger-level output signal at 412 to provide a combined digital signal at 418. The combined digital signal at 418 is received by a logic inverter 419 that is also configured to and output an inverted version of it, that comprises the second digital signal, for receipt by the second circuit component 109. In other examples, the second circuit component 109 may be connected to output 437 and two or more inverters may be scaled to drive a specific load at 437. In such an example two inverters with increasing current drive capability or "strength" may be used.

In this and one or more examples, the level shifter arrangement comprises the high-trigger-level second stage 402A. However, in one or more examples, the second stage may be replaced by a logic inverter, such as a CMOS logic inverter. Accordingly, whether implemented as a stage (and thereby including the series connected DPMOS transistors and the CMOS invertor arrangement between the second supply and the reference voltage) or as a CMOS logic inverter, the embodiment of FIG. 4 may provide for logic inverting of the output of the high-trigger-level first stage 401A. Thus, the second stage 402A or alternative logic inverter is used to invert the signal polarity of the output from the high-trigger-level CMOS inverter arrangement 407A so that the high-trigger-level signal is in phase with the first digital output signal at terminal 113 while the low-trigger-level output signal from the low-trigger-level CMOS inverter arrangement 407B is out of phase with the first digital output signal at terminal 113.

In the example of FIG. 4, the latch 417 comprises a first branch 430 and second branch 431. Each branch includes a terminal to couple to the second voltage supply at line 111 at one end and terminal to couple to the voltage reference at line 107 at the other end. The first branch 430 includes a PMOS transistor 432 and the second branch includes a PMOS transistor 433. The PMOS transistors 432, 4333 of each branch are cross-coupled in that the gate terminal of PMOS 432 is coupled to the drain terminal of the PMOS 433 and the gate terminal of PMOS 433 is coupled to the drain terminal of the PMOS 432.

The branches 430 and 431 each include an NMOS transistor. A first NMOS transistor 434 in the first branch 430 is provided to receive the low-trigger-level output signal at its gate terminal and a second NMOS 435 is provided in the second branch 431 to receive the high-trigger-level output signal at its gate terminal. The combined digital signal is provided from a node 436 in one of the first and second branches; in this case the second branch 431. The node 436 is therefore between one of the cross-coupled PMOS transistors 432 or 431 and a respective one of said first or second NMOS transistor 434 or 436 of the same branch 430, 431.

The use of a latch 417 may be advantageous because not only does it combine the two signals into a single output, it generates a full swing output signal to reduce the need for as many stages to provide the aforementioned tapering.

In one or more embodiments one or more of the first series-connected DPMOS 420, second series-connected DPMOS 421 and PMOS of the CMOS inverter arrangement 407A may have a back-gate terminal coupled to receive the second supply voltage. It will be appreciated that in FIG. 4 connection 438 provides the second supply voltage to the back-gate terminals of the second DPMOS 421 and the PMOS transistor 413. In one or more embodiments one or more of the first series-connected DPMOS 423, second series-connected DPMOS 424 and PMOS 415 of the CMOS inverter arrangement 407B may have a back-gate terminal coupled to receive the second supply voltage.

The embodiment of example FIG. 4 may advantageously provide hysteresis. However, hysteresis may be achieved without the complexity of the high and low trigger level stages by the example embodiment of FIG. 5.

Example FIG. 5 shows a level shifter 500 having three stages comprising a first stage 501, a second stage 502 and a third stage 503. Each stage 501-503 comprises an arrangement 508, 512, 514 of one or more DPMOS transistors, the arrangement coupled in series with a CMOS inverter arrangement 516, 517, 518 between the second voltage supply 111 and the reference voltage, ground 107. The level shifter 500 also optionally includes one or more CMOS logic inverters—three in this example comprising 504, 505, 506—before the second output signal is provided at output 507.

In general, it will be appreciated that the level shifter 500 of FIG. 5 may have at least two stages 501, 502, 503 and zero, at least one or at least two CMOS logic inverters 504, 505, 506.

The DPMOS arrangement 508 of the first stage 501 comprises a first DPMOS transistor 510 and a second DPMOS transistor 511 (which may be indicative of a plurality of parallel-connected DPMOS as in the previous examples). The DPMOS arrangement 512 of the second stage 502 comprises a single DPMOS transistor 513 (or a plurality of parallel-connected DPMOS). The DPMOS arrangement 514 of the third stage 503 comprises a single DPMOS transistor 515 (or a plurality of parallel-connected DPMOS).

In this example, the hysteresis is provided by the presence of a switch 520 configured to short one or more of the diode-connected PMOS transistors 510, 511 of the first arrangement 508 by selectively providing an alternative current path that can be switched on and off. The switch 520 in this example is configured to selectively short the second DPMOS 511. The switch is controlled by the output of the CMOS inverter arrangement of the second stage 502. This set-up may advantageously provide hysteresis with reduced complexity.

The switch 520 may comprise a transistor, such as a PMOS transistor, having its source terminal coupled to the source terminal of one of the DPMOS transistors 511 and a drain terminal coupled to the drain terminal of the same DPMOS transistor 511. The gate terminal of the switch 510 is coupled to the output of the second CMOS inverter arrangement 517 at 521 to receive the second digital output signal or an intermediate digital output signal between the second and third stages, depending on how many stages are provided.

In one or more examples, a back-gate terminal of the second DPMOS transistor 511 (i.e. the one or more shorted by the switch) may be coupled to the second supply voltage at line 111. In one or more examples, a back-gate terminal of the switch 520 may be coupled to the second supply voltage at line 111. A connection 528 is shown providing the back-gate connections.

In general, for any of the embodiments, a back-gate terminal of at least one of the DPMOS transistors may be coupled to the second supply voltage at 111, which may be advantageously used to control trigger levels of the CMOS invertor arrangements 516, 517, 518.

In one or more examples, the first CMOS invertor arrangement 516 comprises a PMOS transistor 522 connected in series with an NMOS transistor 523, and wherein the PMOS transistor 522 has a connection 524 between its source terminal and its back-gate terminal. This connection 524 may be provided to reduce the influence of the body effect. Thus, in use, the first CMOS inverter arrangement 516 receives the first digital output signal at the gate terminals of its constituent PMOS and NMOS transistors 522, 523. The output from a node between the connected drain terminals is used to drive the second CMOS inverter arrangement 517. The second CMOS inverter arrangement 517, in turn, drives the third CMOS inverter arrangement 518. In this example the third CMOS inverter arrangement is the final stage and provides its output to drive the three CMOS inverters 504, 505,506 which are sized to properly drive a specific load connected at 507 (which may be considered additional stages of the level shifter). As mentioned, the hysteresis is implemented using the switch 520 which shorts the DPMOS 511 and is driven by the output of the second CMOS inverter arrangement 517. Thus, when the voltage of the first output signal at 525 starts low, DPMOS transistor 511 is shorted and the trigger or trip level provided is higher than when the first output signal at 525 is high. In the second state when the first output signal at 525 is high, switch 520 is off and DPMOS 511 is not shorted and therefore the trigger or trip level provided is lower.

Accordingly, the selective shorting of the first DPMOS arrangement 508 provides hysteresis.

Example FIG. 6 shows a further embodiment comprising one stage 601 and three CMOS inverters 602, 603 and 604. The stage 601 has the same general structure as in previous embodiments.

In the example of FIG. 6 however, the level shifter arrangement 600 includes an NMOS transistor 605 for high-voltage protection. The NMOS transistor 605 has a drain terminal 606 for receiving the first digital output signal and a source terminal 607 for providing the first digital output signal once passed through the NMOS 605 to the CMOS inverter arrangement 608 of the first stage 601. A gate terminal 609 of the NMOS transistor 605 is coupled to receive the second supply voltage at line 111.

The NMOS transistor 605 for high-voltage protection may comprise a double-diffused metal-oxide-semiconductor, CMOS, transistor. In one or more examples, the NMOS transistor comprises one of a VDMOS (vertical double-diffused metal oxide semiconductor) and LDMOS (lateral double-diffused metal oxide semiconductor) transistor.

It will be appreciated that any of the embodiments described herein may include said NMOS transistor 605 for high-voltage protection. The use of the NMOS transistor 605 may yield a very large input-voltage range. The NMOS transistor 605 will limit the voltage at the gate terminals of the PMOS and NMOS of the first CMOS inverter arrangement 608 and may thereby avoid damage to the gate oxide of these components. It will be appreciated that because of the threshold voltage of NMOS transistor 605, the voltage at the gate terminals of the PMOS and NMOS of the first CMOS invertor arrangement 608 will stay well below the second supply voltage. In one or more examples, further components or arrangements may be added to avoid static current flow in the first stage 601, such as by using series connected DPMOS in the first DPMOS arrangement 610.

Figure 7:
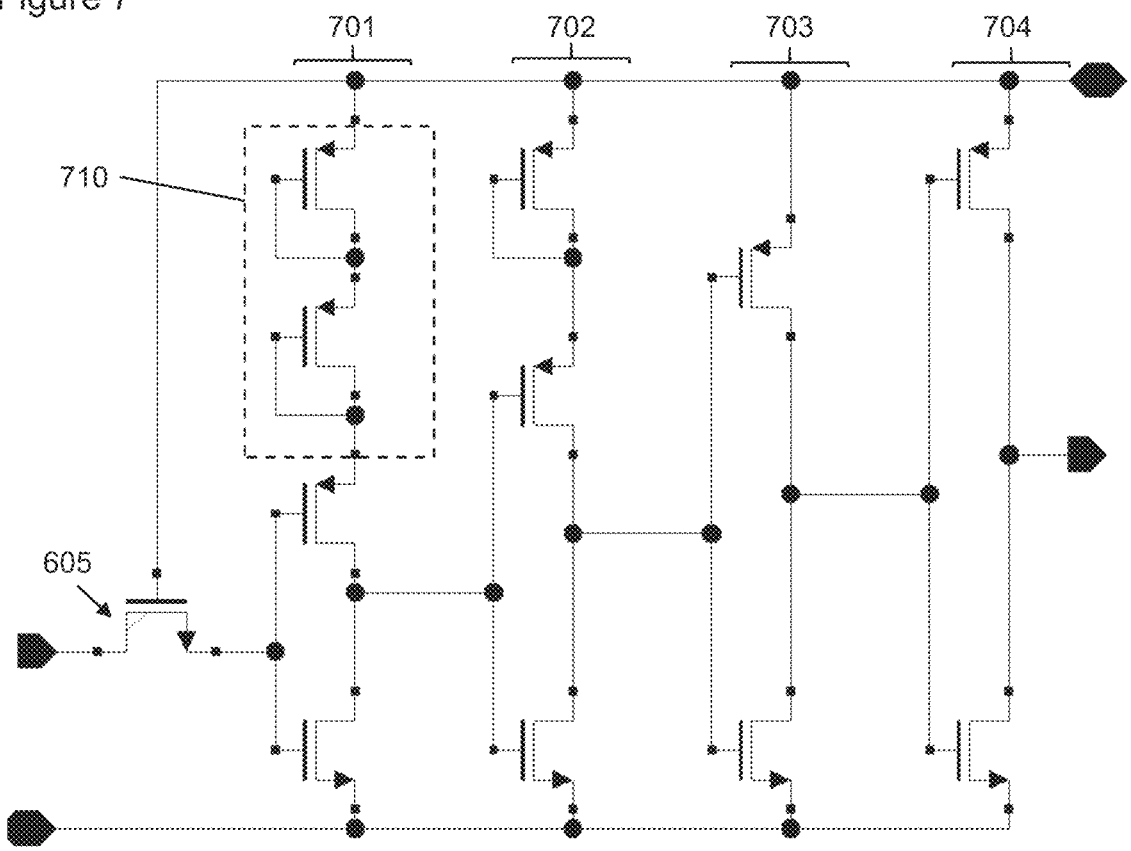
FIG. 7 shows a sixth example embodiment illustrating the addition of high voltage protection that may be applied in any other embodiment.

Example FIG. 7 is substantially the same as example FIG. 6 however, in this example, two stages 701, 702 are provided and two CMOS inverters 703 and 704.

The use of the NMOS transistor 605 has been found not to prevent operation at small input voltages and the series-connected DPMOS transistors 710 are effective at preventing static current consumption during such operating conditions. Thus, the level shifter 600 with the NMOS transistor for high voltage protection and at least one or at least two stages 601, 701, 702 may provide an "input buffer" with a truly wide input-voltage range.

It will be appreciated that the level shifters 200, 300, 400, 500, 600, 700 may be considered as an "input buffer" that facilitates the passage of digital signalling from different voltage domains and provides for modification of the voltage levels of the digital signalling.

Figure 8:
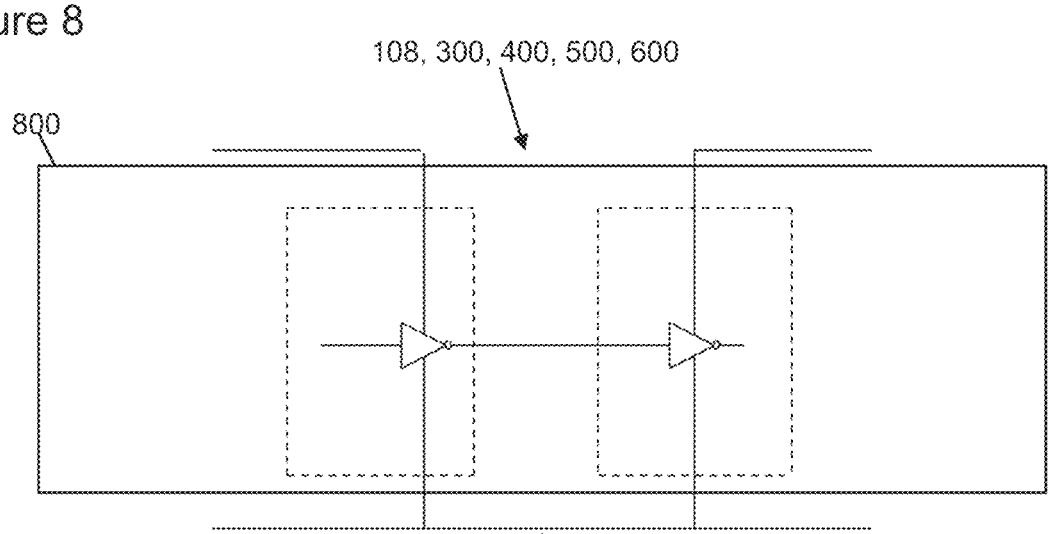
FIG. 8 shows a device, such as a wireless communication device including the apparatus of any of the previous embodiments.

Example FIG. 8 shows a wireless communication device 800 including the apparatus of any of the embodiments 108, 300, 400, 500, 600 as described herein.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An apparatus comprising:
   a first voltage domain circuit including a first circuit component configured to provide a first digital output signal, wherein the first voltage domain circuit is configured to receive a first supply voltage and wherein the first digital output signal has high and low states and the voltage of the high state is based on the first supply voltage;
   a second voltage domain circuit comprising a second circuit component, wherein the second voltage domain circuit is configured to receive a second supply voltage that is greater than the first supply voltage; and
   a level shifter arrangement configured to receive the first digital output signal and generate a second digital output signal based on the first digital output signal with an increased voltage level of the high state, wherein the level shifter arrangement is configured to provide said second digital output signal for input to the second circuit component, wherein the level shifter arrangement comprises:
   a first stage comprising:
      a first arrangement of one or more diode-connected PMOS transistors, wherein a first source terminal of at least one of the one or more diode-connected PMOS transistors of the first arrangement is configured to couple to the second supply voltage,
      a first CMOS inverter arrangement having a first terminal coupled to a first drain terminal of at least one of the one or more diode-connected PMOS transistors of the first arrangement and a first voltage reference terminal for coupling to a voltage reference, wherein the first CMOS inverter arrangement is configured to receive the first digital output signal; and
      a switch configured to short one of the diode-connected PMOS transistors of the first arrangement; and
   a second stage comprising:
      a second arrangement of one or more diode-connected PMOS transistors, wherein a second source terminal of at least one of the one or more diode-connected PMOS transistors of the second arrangement is configured to couple to the second supply voltage, wherein the switch of the first stage is controlled by an output of the second stage;
      a second CMOS inverter arrangement having a second terminal coupled to a second drain terminal of at least one of the one or more diode-connected PMOS transistors of the second arrangement and a second voltage reference terminal for coupling to the voltage reference; and
   a final stage comprising a final CMOS inverter arrangement configured to output the second digital output signal.

2. The apparatus of claim 1, wherein
   wherein the first CMOS inverter arrangement is configured to provide a first intermediate digital output signal to the second CMOS inverter arrangement of the second stage, wherein the second CMOS inverter arrangement is configured to receive the intermediate digital output signal and provide the second digital output signal for the second circuit component; and
   wherein the first and second arrangements of diode-connected PMOS transistors are configured such that a voltage drop provided by the first arrangement is greater than the voltage drop provided by the second arrangement.

3. The apparatus of claim 1, wherein the first arrangement of one or more diode-connected PMOS transistors comprises one of:
   a plurality of diode-connected PMOS transistors connected in series; and
   a plurality of diode-connected PMOS transistors connected in parallel.

4. The apparatus of claim 3 wherein the first arrangement comprises a plurality of diode-connected PMOS transistors connected in series and wherein at least one or more of the diode-connected PMOS transistors have a separate n-well.

5. The apparatus of claim 2, wherein the first arrangement comprises a plurality of diode-connected PMOS transistors connected in series and the second arrangement comprises one or more diode-connected PMOS transistors connected in series and said difference in voltage drop is provided by a greater number of diode-connected PMOS transistors connected in series in the first arrangement relative to the number of diode-connected PMOS transistors connected in series in the second arrangement.

6. The apparatus of claim 2, wherein the first arrangement comprises one or more diode-connected PMOS transistors connected in parallel and the second arrangement comprises a plurality of diode-connected PMOS transistors connected in parallel and said difference in voltage drop is provided by a greater number of diode-connected PMOS transistors connected in parallel in the second arrangement relative to the number of diode-connected PMOS transistors connected in parallel in the first arrangement.

7. The apparatus of claim 2, wherein the level shifter arrangement comprises at least three stages and the voltage drop of diode-connected PMOS transistor arrangements of each stage of the at least three stages incrementally and monotonically decreases from the first stage that receives the first digital output signal to the final stage that provides the second digital output signal for the second circuit component.

8. The apparatus of claim 6, wherein each of the diode-connected PMOS transistors of the first arrangement and the second arrangement have a same unit size.

9. The apparatus of claim 1, wherein the switch comprises a transistor having its source terminal and drain terminal coupled to short said one of the diode-connected PMOS transistors of the first arrangement and its gate terminal coupled to the second CMOS inverter arrangement.

10. The apparatus of claim 2, wherein the first CMOS inverter arrangement comprises a PMOS transistor connected in series with a NMOS transistor, and wherein the PMOS transistor of the first CMOS inverter arrangement has a connection between its source terminal and its back-gate terminal.

11. The apparatus of claim 1, wherein the level shifter arrangement includes an NMOS transistor for high-voltage protection, said NMOS transistor having a drain terminal for receiving the first digital output signal and a source terminal for providing the first digital output signal to the first CMOS inverter arrangement of the first stage, wherein the gate of the NMOS transistor for high-voltage protection is coupled to receive the second supply voltage.

12. The apparatus of claim 11, wherein said NMOS transistor for high-voltage protection comprises a double-diffused metal-oxide-semiconductor, DMOS, transistor.

13. A wireless communication device including the apparatus of claim 1.

14. The apparatus of claim 1 wherein each arrangement of one or more diode-connected PMOS transistors of each stage comprises a chain of diode-connected PMOS transistors wherein a first diode-connected PMOS transistor in the chain or a first parallel connected plurality of diode-connected PMOS transistors in the chain have a source terminal/terminals for coupling to the second supply voltage and a drain terminal/terminals for coupling to zero, one or more subsequent diode-connected PMOS transistors in the chain or subsequent parallel connected plurality of diode-connected PMOS transistors in the chain prior to the connection to the first terminal of the CMOS inverter arrangement.

* * * * *